United States Patent [19]

Sakurai et al.

[11] Patent Number: 5,126,806
[45] Date of Patent: Jun. 30, 1992

[54] LATERAL INSULATED GATE BIPOLAR TRANSISTOR

[75] Inventors: Naoki Sakurai; Mutsuhiro Mori; Tomoyuki Tanaka, all of Hitachi, Japan

[73] Assignee: Hitachi, Ltd., Tokyo, Japan

[21] Appl. No.: 442,608

[22] Filed: Nov. 29, 1989

[30] Foreign Application Priority Data

Dec. 2, 1988 [JP] Japan ................. 63-304145

[51] Int. Cl.$^5$ ............................................ H01L 29/10
[52] U.S. Cl. .................... 357/23.4; 357/35; 357/43
[58] Field of Search ............ 357/23.4, 23.14, 37, 357/38, 43, 38 L, 35, 23.3, 50

[56] References Cited

U.S. PATENT DOCUMENTS

| 4,567,502 | 1/1986 | Nakagawa et al. | 357/23.4 |
| 4,612,449 | 9/1986 | Patalong | 357/38 |
| 4,743,952 | 5/1988 | Baliga | 357/38 |
| 4,794,441 | 12/1988 | Sugawara et al. | 357/23.4 |
| 4,881,112 | 11/1989 | Matsushita | 357/23.4 |
| 4,901,131 | 2/1990 | Takahashi | 357/23.14 |
| 4,901,132 | 2/1990 | Kuwano | 357/37 |
| 4,947,226 | 8/1990 | Huang et al. | 357/38 |

FOREIGN PATENT DOCUMENTS 0047392 3/1982 European Pat. Off. .
0338312 10/1989 European Pat. Off. .
59-132667 7/1984 Japan .

OTHER PUBLICATIONS

Fossum et al., "Network Representations of LIGBT Structures for CAD of Power Integrated Circuits", Apr. 1988, IEEE Transactions on Electron Devices, vol. 35, No. 4.
Chow, et al., "Latching in Lateral Insulated Gate Bipolar Transistors"-Dec. 1987-IEEE.
Becke, "Approaches to Isolation in High . . . " Dec. 1985-IEEE.
Rossel, et al. "Smart Power and High Voltage . . . ", Microelectronics Journal-Spring 1989.

Primary Examiner—Andrew J. James
Assistant Examiner—Courtney A. Bowers
Attorney, Agent, or Firm—Antonelli, Terry, Stout & Kraus

[57] ABSTRACT

A lateral insulated gate bipolar transistor comprises a p layer and a p$^+$ layer provided apart from each other and extending from a surface of an n$^-$ layer into the n$^-$ layer, an n$^+$ layer provided extending from a surface of the p layer into the p layer, a first main electrode provided in ohmic contact with the n$^+$ layer and the p layer, a second main electrode provided in ohmic contact with the p$^+$ layer, and a control electrode provided through an insulating film on the n$^+$ layer, the p layer and the n$^-$ layer on the side of the first main electrode away from the second main electrode.

23 Claims, 7 Drawing Sheets

F I G. 1A
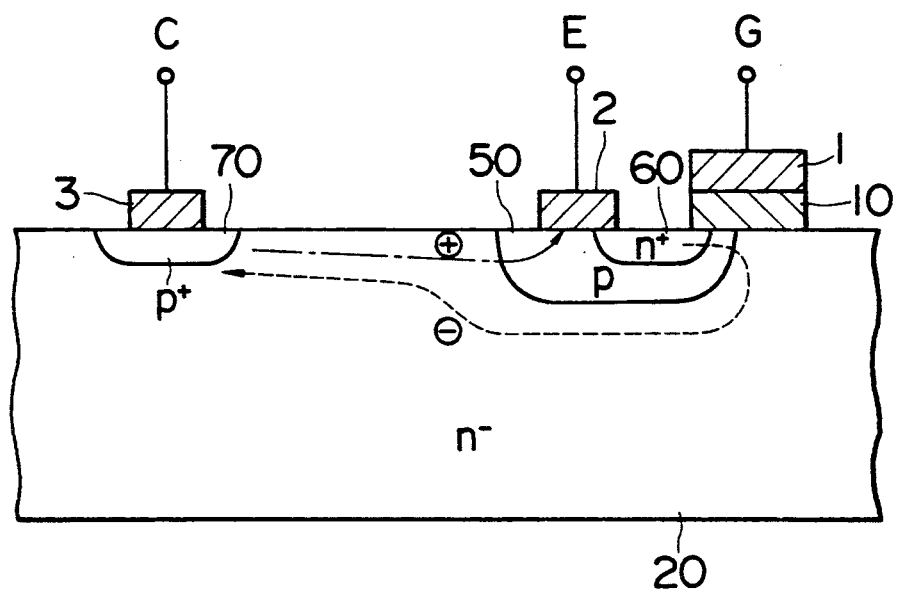
F I G. 1B
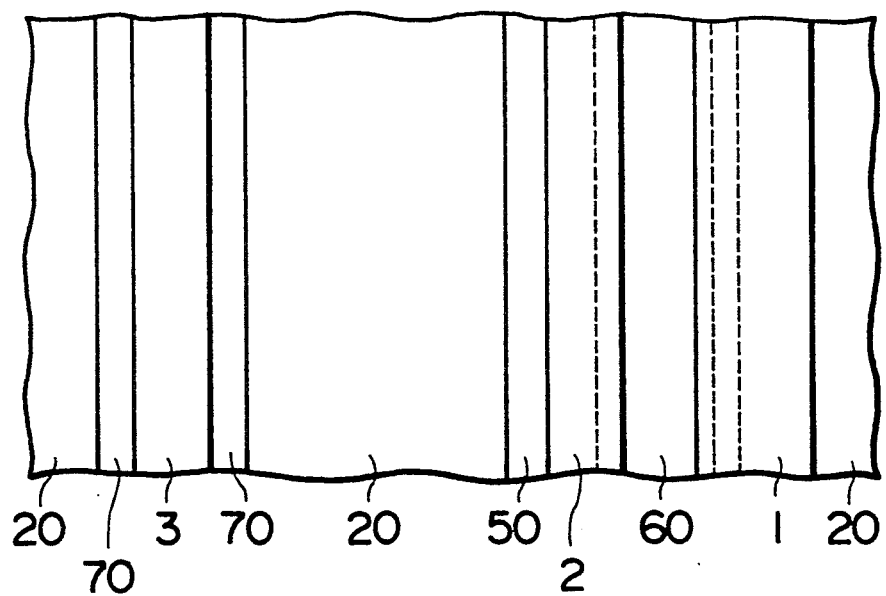

LATERAL INSULATED GATE BIPOLAR TRANSISTOR

BACKGROUND OF THE INVENTION

The present invention relates to a lateral insulated gate bipolar transistor, and more particularly to improvement on a latch-up prevention ability of the lateral insulated gate bipolar transistor.

In the recent years, an insulated gate bipolar transistor (hereinafter referred to as IGBT) is highlighted as a semiconductor device capable of controlling a relatively large current at a high speed. In order to integrate the IGBT together with another device, it is desirable that an emitter (cathode), a gate (control electrode) and a collector (anode) are placed in the same plane. An example of an IGBT structure satisfying this requirement is a lateral IGBT disclosed by JP-A-59-132667. The disclosed structure is shown in FIG. 11. In an n⁻ layer 20 are independently provided a p layer 50 having an impurity concentration higher than that of the n⁻ layer 20 and a p+ layer 70 having an impurity concentration higher than that of the p layer 50. In the p layer 50 is provided an n+ layer 60 having an impurity concentration higher than the p layer 50. The p layer 50 and the n+ layer 60 are electrically short-circuited by an emitter electrode 2. A collector electrode 3 is provided on a surface of the p+ layer 70 in ohmic contact with the p+ layer 70. An insulating film 10 is provided stretching over the surfaces of the n+ layer 60, the p layer 50 and the n⁻ layer 20 and a gate electrode 1 is provided on the insulating film 10. The n+ layer 60 and the insulating film 10 are provided opposite to the p+ layer 70 and the n+ layer 60 exists between the p+ layer 70 and a region where the p layer 50 and the emitter electrode 2 are in ohmic contact with each other. In this transistor, when a positive potential is applied to the gate electrode 1, the conductivity of a surface portion of the p layer 50 under the insulating film 10 is inverted into an n type so that a channel is formed. Electrons ⊖ flowing out of the n+ layer 60 pass through the channel and the n⁻ +layer 70 and reach the p+ from which positive holes ⊕ are injected. Thereby, the n⁻ layer 20 having a high resistance is conductivity-modulated to exhibit a low resistance, thereby providing a merit that an on⁻ resistance lower than that of a MOSFET having the same forward blocking characteristic can be realized.

In the above-mentioned conventional lateral IGBT, the n+ layer 60 exists between the p+ layer 70 and the region where the p layer 50 and the emitter electrode 2 are in ohmic contact with each other. In this case, the positive holes ⊕ injected from the p+ layer 70 concentrically flow through the p layer 50 under the n+ layer 60 and reach the emitter electrode. Therefore, a potential drop is produced due to a resistance component R of the p layer 50 in a lateral direction. As a result, there is a problem that a pn junction formed by the n+ layer 60 and the p layer 50 is forward-biased by the potential drop to cause the injection of electrons from the n+ layer 60 into the p layer 50 so that there occurs a so-called latch-up phenomenon in which a parasitic thyristor formed by the n+ layer 60, the p layer 50, the n⁻ layer 20 and the p+ layer 70 is turned on, thereby making it impossible to control a current by the gate.

SUMMARY OF THE INVENTION

An object of the present invention is to provide an improved lateral IGBT which has an improved latch-up prevention ability.

The above object is realized in such a manner that a portion where an emitter electrode electrically contacts a semiconductor region adjacent to a semiconductor region serving as an emitter is provided nearer to a semiconductor region serving as a collector than the semiconductor region serving as the emitter.

In the present invention, carriers injected from the semiconductor region serving as the collector can arrive at the emitter electrode without passing below the semiconductor region serving as the emitter. Therefore, the latch-up prevention ability can be improved, thereby making it possible to control a large current.

BRIEF DESCRIPTION OF THE DRAWINGS

FIGS. 1A and 1B are a longitudinal cross section view and a plan view respectively showing a first embodiment of the present invention;

DESCRIPTION OF THE PREFERRED EMBODIMENTS

Figure 2:
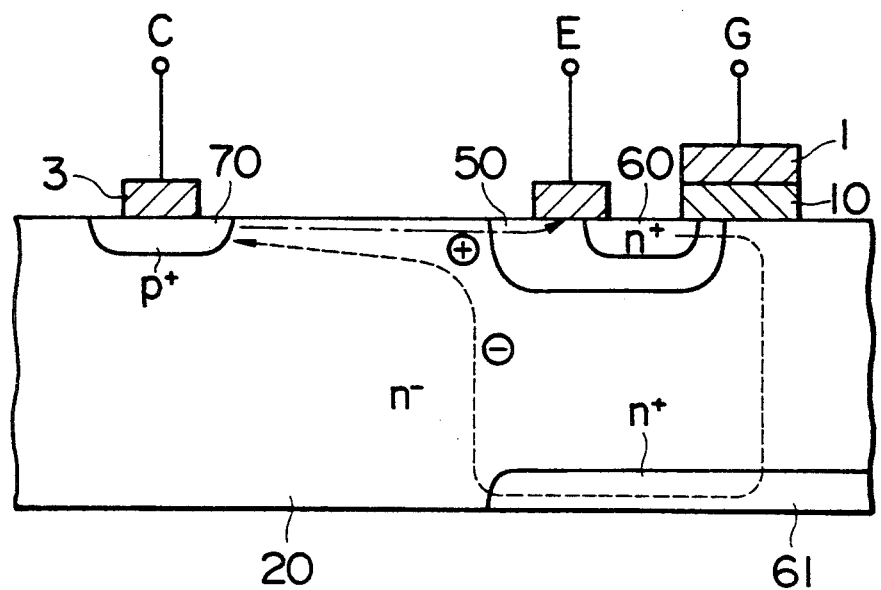
FIG. 2 is a longitudinal cross section showing a second embodiment of the present invention.

The present invention will now be explained by virtue of the accompanying drawings which show embodiments thereof.

FIGS. 1A and 1B are a longitudinal cross section view and a plan view respectively showing a first embodiment of the present invention. On the side of one surface of an n⁻ layer 20, a p layer 50 and a p+ layer 70 extending from the surface of the n⁻ layer 20 thereinto are provided apart from each other. In the p layer 50 is provided an n+ layer 60 which extends from a surface of the p layer 50 thereinto. An insulating film 10 is provided stretching over the surfaces of the n+ layer 60, the p layer 50 and the n⁻ layer 20 and a gate electrode 1 is provided on the insulating film 10. The p layer 50 and the n+ layer 60 are provided in ohmic contact with an emitter electrode 2 at a position nearer to the p+ layer 70 than the gate electrode 1. A region where the p layer 50 and the emitter electrode 2 are in ohmic contact with each positioned nearer to the p+ layer 70 than is the n+ layer 60. A collector electrode 3 is provided in ohmic contact with a surface of the p+ layer 70. The p layer 50, the n+ layer 60 and the p+ layer 70 are juxtaposed, in the one surface of the n⁻ layer 20, with their stripe shapes the longitudinal directions of which are parallel to each other. Necessarily, the emitter electrode 2, the gate electrode 1 and the collector electrode 3 are provided along the p layer 50, the n+ layer 60 and the p+ layer 70, respectively.

Next, explanation will be made of the operation of the lateral IGBT having the above-mentioned construction. When a positive potential is applied to the gate electrode 1 in a state in which a voltage bringing the collector electrode 3 into a positive potential and the emitter electrode 2 into a negative potential is applied between the collector electrode 3 and the emitter electrode 2, a channel is produced in a surface of the p layer 50 under the insulating film 10 so that electrons ⊖ are ejected out of the n+ layer 60 through the channel and reach the p+ layer 70 through the n− layer 20. In FIG. 1A, the flow of electrons ⊖ is indicated by a dotted line. A pn junction between the p+ layer 70 and the n− layer 20 is forward-biased by the electrons ⊖ reaching the p+ layer 70 so that positive holes ⊕ are injected from the p+ layer 70 into the n− layer 20. The positive holes ⊕ pass through the n− layer 20 and the p layer 50 and reach the emitter electrode 2. In FIG. 1A, the flow of positive holes ⊕ is indicated by one-dotted chain line. Since the region where the emitter electrode 2 and the p layer 50 are in ohmic contact with each other is positioned nearer to the p+ layer 70 than the n+ layer 60, the positive holes ⊕ can arrive at the emitter electrode 2 without passing under the n+ layer 60, thereby providing a merit that the latch-up prevention ability is improved and hence it is possible to control a large current. In the present embodiment, it is preferable that the impurity concentrations of the p' layer 70, the n− layer 20, the p layer 50 and the n+ layer 60 are equal to $1 \times 10^{18}$ to $1 \times 10^{20}$ atoms/cm$^3$, $1 \times 10^{13}$ to $5 \times 10^{15}$ atoms/cm$^3$, $1 \times 10^{15}$ to $5 \times 10^{18}$ atoms/cm$^3$ and equal to or higher than $1 \times 10^{19}$ atoms/cm$^3$, respectively.

FIG. 1A shows the minimum unit of the lateral IGBT for explaining the basic concept of the present invention. An actual product has a structure with a multiplicity of such minimum units provided in parallel.

FIG. 2 is a longitudinal cross section showing a second embodiment of the present invention. In FIG. 2, the same reference numerals as those in FIG. 1A designate the same portions as those in FIG. 1A. An n+ buried layer 61 is provided in an n− layer 20 below a p layer 50 and apart from the p layer 50. In the present embodiment, since electrons ⊖ flow through the n+ buried layer 61 having a low resistance, the resistance of a region through which the electrons ⊖ flow is reduced, thereby providing the benefit that ON resistance is lowered as compared with that in the first embodiment. The present embodiment has such a plane structure as shown in FIG. 1B.

Figure 3:
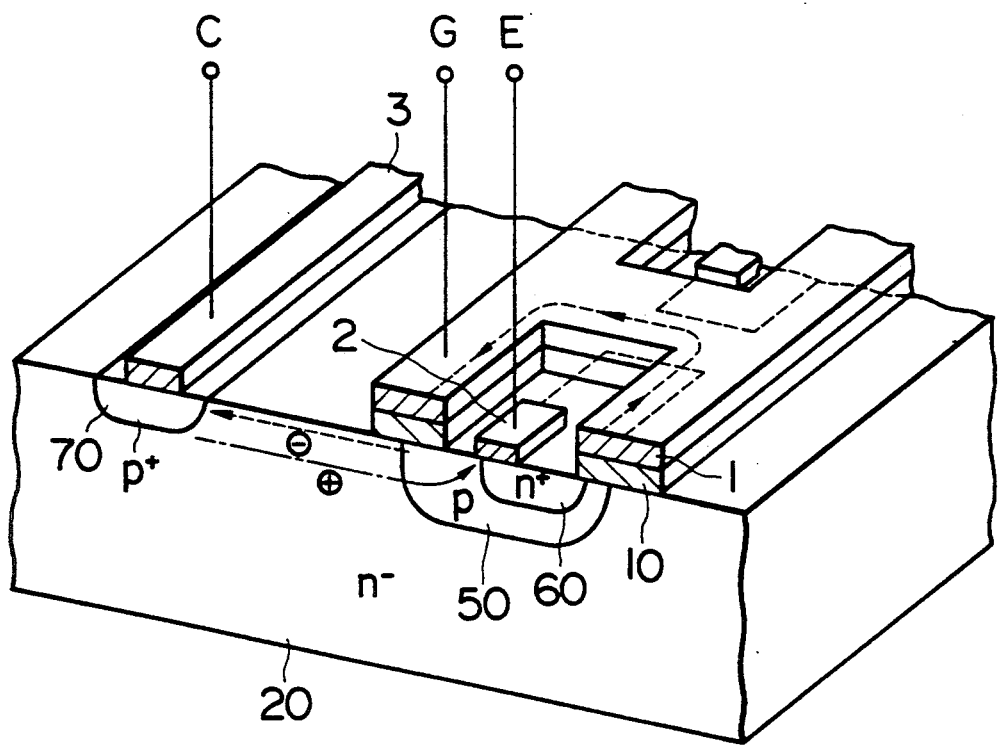
FIG. 3 is a perspective view showing a third embodiment of the present invention.

FIG. 3 is a perspective view showing a third embodiment of the present invention. In FIG. 3, the same reference numerals as those in FIG. 1A designate the same portions as those in FIG. 1A. An insulating film 10 is provided stretching over a p layer 50 and an n− layer 20 at a side near to a collector electrode 3 and stretching over the n− layer 20, the p layer 50 and a n+ layer 60 at a side away from the collector electrode 3. Each of the p layer 50 and a p+ layer 70 is formed in a surface of the n− layer 20 and with a shape elongated in one direction and the n+ layer 60 is constructed by a plurality of regions which are provided in parallel along a longitudinal direction of the p+ layer 70. Therefore, the collector electrode 3 is formed along a longitudinal direction of the p+ layer 70, an emitter electrode 2 is divided into a plurality of portions and a gate electrode 1 is formed so as to enclose each emitter electrode 2. In the present embodiment, electrons ⊖ flowing out of the n+ layer 60 pass through a channel produced in the vicinity of the p layer 50 under the insulating film 10 and flow into the n− layer 20 from a portion under the insulating film 10 opposing the p+ layer 70. Therefore, the electrons and positive holes take the same path in the n− layer 20 and hence the conductivity is sufficiently modulated, thereby providing the benefit that on resistance is lower than that in the first embodiment is exhibited.

Figure 4A:
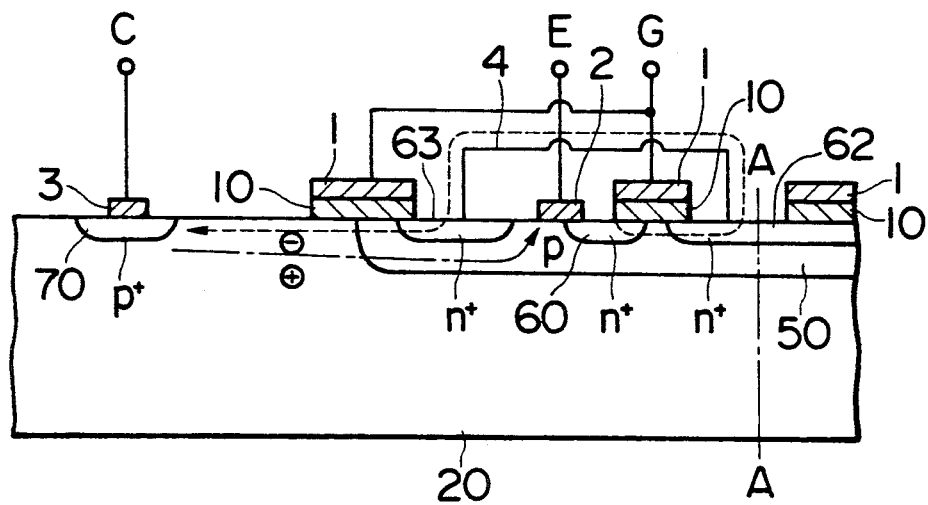
FIGS. 4A and 4B are a longitudinal cross section view and a plan view respectively showing a fourth embodiment of the present invention.
Figure 4B:
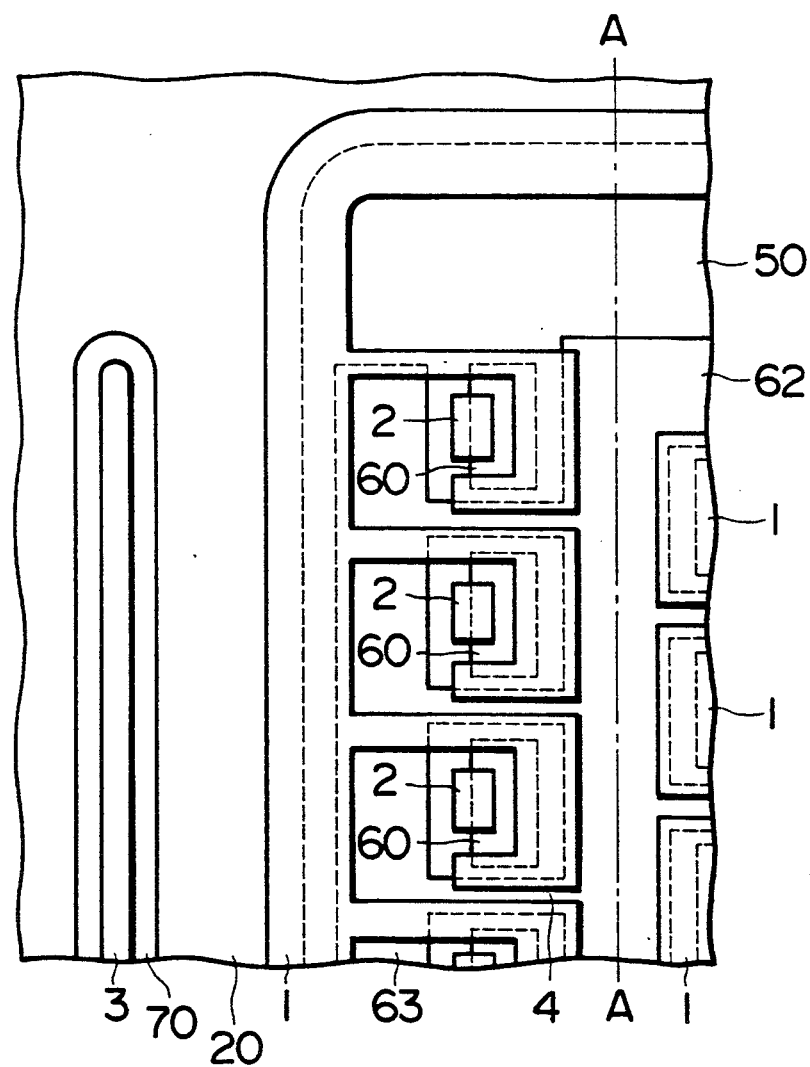

FIGS. 4A and 4B are a longitudinal cross section and a plan view showing a fourth embodiment of the present invention. A p+ layer 70 and a p layer 50 elongated in one direction are independently provided in an n− layer 20. An n+ layer 63, an n+ layer 60 and an n+ layer 62 are provided in the p layer 50 and along a longitudinal direction of the p layer 50. The n+ layer 60 is positioned between the n+ layers 62 and 63 and are divided into a plurality of regions along the longitudinal direction of the p layer 50. An emitter electrode 2 includes a plurality of portions which are in ohmic contact with the n+ layer 60 and the p layer 50 positioned on the side near to the p+ layer 70 than n+ layer 60. A collector electrode 3 is provided on a surface of the p+ layer 70 along a longitudinal direction and in ohmic contact with the p+ layer 70. A gate electrode 1 is formed on the n+ layer 63, the p layer 50 and the n− layer 20 through an insulating film 10 on a side near the collector electrode 3 so as to stretch over the layers 63, 50 and 20 and is formed on the n+ layer 60, the p layer 50 and the n+ layer 62 through the insulating film 10 on a side away from the collector electrode 3 as to stretch over the layers 60, 50 and 62. Portions of the gate electrode 1 near to and away from the collector electrode 3 are integral with each other. The n+ layer 62 and the n+ layer 63 are connected by an n+ layer 4 but may be connected by a conductor in place of the n+ layer 4. Each of opposite ends of the p layer 50 in the longitudinal direction thereof has a predetermined curvature for the purpose of mitigating the concentration of an electric field and the gate electrode 1 is provided through the insulating film 10 on the periphery of the p layer 50 and the n− layer 20 adjacent thereto. The p layer 50, the n+ layer 60, the n+ layer 62 and the n+ layer 63 have a symmetrical structure with respect to line A—A (see FIG. 4B). In this case, two rows for each of the n+ layer 60 and the emitter electrode 2 are provided in a longitudinal direction. Preferably, the two rows are positionally shifted from each other in the longitudinal direction. An actual device has a structure in which the p+ layers 70 and the p layer 50 are alternately arranged so that the p+ layers 70 are positioned at opposite outsides.

The operation of the present embodiment is as follows. When a positive potential is applied to the gate electrode 1 in a state in which a voltage bringing the collector electrode 3 into a positive potential is applied between the collector electrode 3 and the emitter electrode 2, a channel is formed in a surface of the p layer 50 lying below the insulating film 10. With the formation of this channel, electrons ⊖ from the n+ layer 60 flow into the n+ layer 62 through the channel. The electrons ⊕ arriving at the n+ layer 62 reach the n+ layer 63 through the n+ layer 4 and pass through the channel formed in the p layer 50 below a portion of the gate electrode 1 near to the collector electrode 3 to flow into the n− layer 20, thereby arriving at the p+ layer 70. The flow of electrons ⊖ is indicated by dotted line in FIG. 4A. On the other hand, positive holes ⊕ from the p+ layer 70 take a route in which they pass through the n− layer 20 to enter into the p layer 50 and reach the emitter electrode 2, as indicated by one-dotted chain line in FIG. 4A. Thus, in the present embodiment, since the flow paths of the electrons ⊖ and the positive holes ⊕ coincide with each other, a sufficient conductivity modulation is made, thereby realizing a lateral IGBT which has an on-resistance lower than that in the first embodiment. Also, a distance along which the electrons flow through the channel is shortened as compared with the third embodiment. Namely, the sum of the length of the channel between the n+ layer 60 and the n+ layer 62 and the length of the channel between the n+ layer 63 and the n− layer 20 in the present embodiment is shorter than the length of the channel in the third embodiment extending from the n+ layer 60 to the n− layer 20 and hence the flow distance of electrons ⊖ is short, thereby providing an advantage of low on-resistance.

Figure 5:
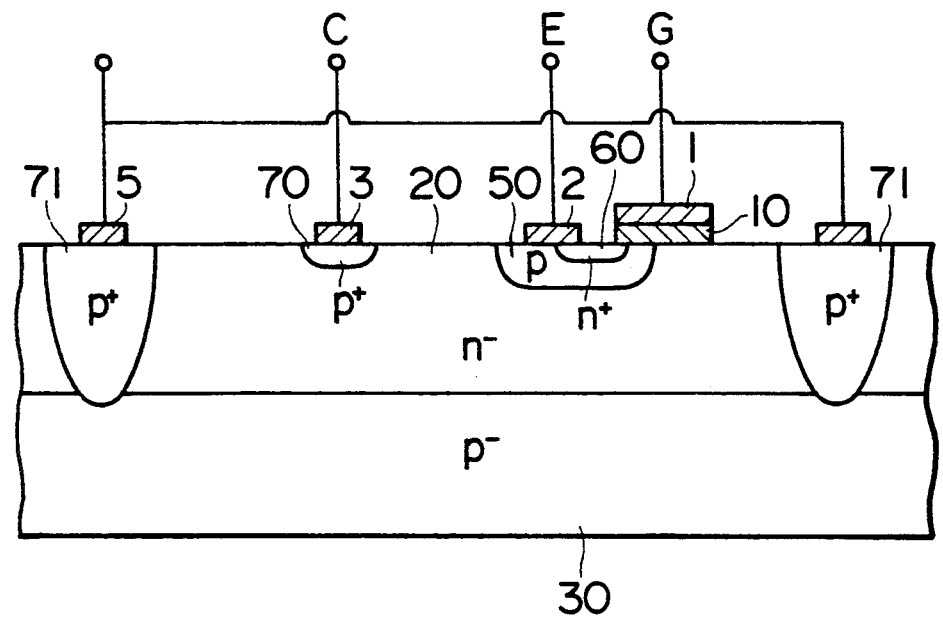
FIGS. 5 to 8 are longitudinal cross section views showing fifth to eighth embodiments of the present invention respectively.

FIG. 5 is a longitudinal cross section showing a fifth embodiment of the present invention. The present embodiment has a structure in which an n− layer 20 is formed on a p− layer 30 and is surrounded by a p+ layer 71. An electrode 5 is provided on a surface of the p+ layer 71 in ohmic contact with the p+ layer 71. The lowest potential is applied to the electrode 5 so that the p+ layer 71 and the p− layer 30 are reverse-biased relative to the n− layer 20. Therefore, the present embodiment has the benefit that the lateral IGBT formed on the same p− layer 30 is electrically isolated from the other elements or devices. Such formation of a lateral IGBT in the pn− isolated substrate is applicable to all the other embodiments excepting an embodiment which will be explained in conjunction with FIG. 6.

Figure 6:
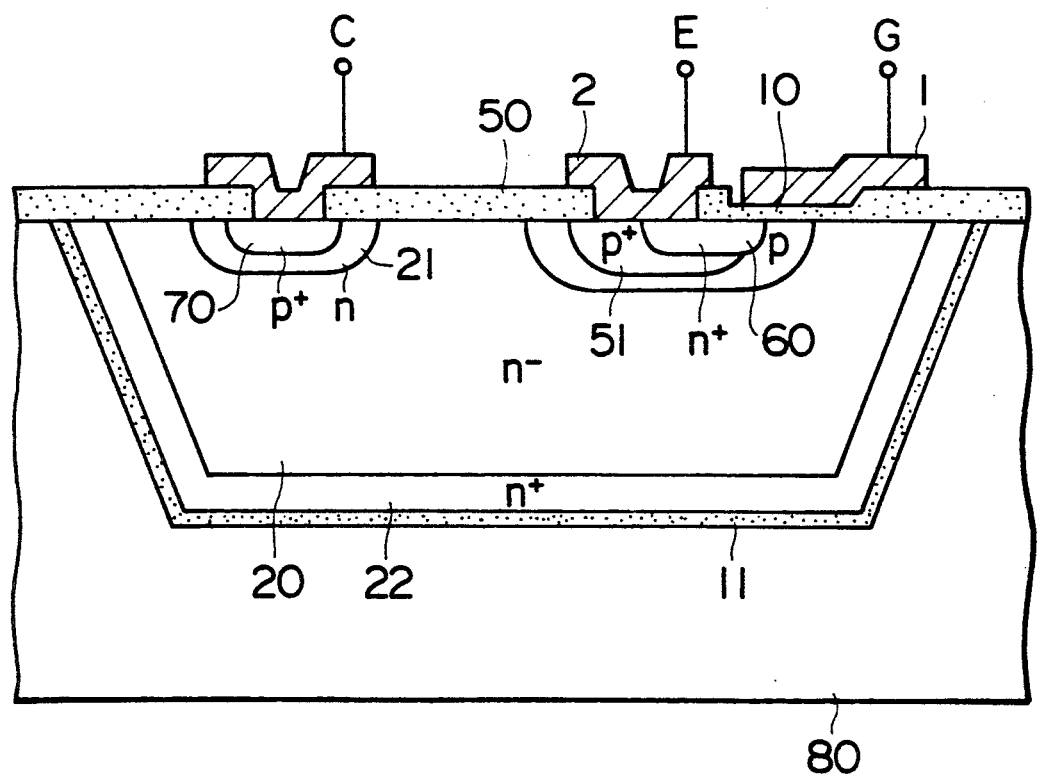

FIG. 6 is a longitudinal cross section showing a sixth embodiment of the present invention. In the present embodiment, an n− layer 20 is a monocrystalline region which is island-wise formed through an insulating film (or dielectric film) 11 in a supporting substrate 80. In the fifth embodiment, positive holes injected from the p+ layer 70 may flow as a leakage current into the electrode 5 applied with the lowest potential, thereby resulting in a loss. In the present embodiment, on the other hand, all of positive holes flow into an emitter electrode 2, thereby providing a merit that any leakage current can be prevented. In the present embodiment, an n region 21 having an impurity concentration higher than the n− layer 20 is formed in a portion of the n− layer 20 adjacent to the p+ layer 70 and an n+ layer 22 is formed in a portion of the n− layer 20 adjacent to the insulating film 11. Also, a p layer 50 has a p+ region 51 adjacent to an n+ layer 60.

Such formation of a lateral IGBT in the monocrystalline island of the dielectric-isolated substrate is applicable to all the other embodiments excepting the embodiment shown in FIG. 5.

Figure 7:
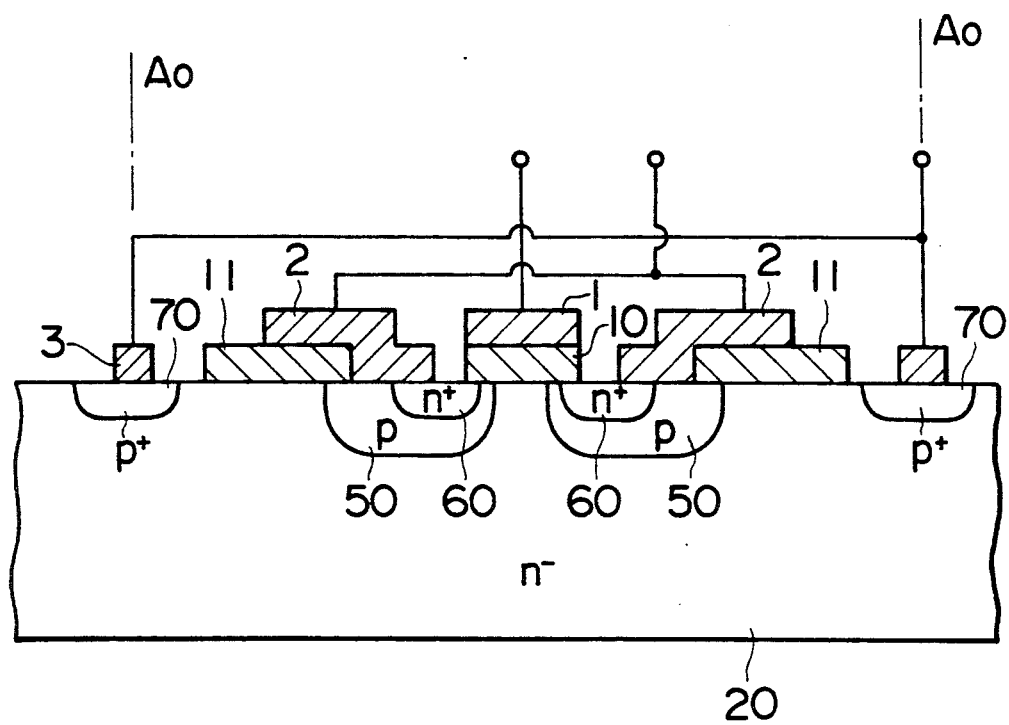

FIG. 7 is a longitudinal cross section showing a seventh embodiment of the present invention. Two p layers 50 and two p+ layers 70 are respectively provided symmetrically with respect to an insulating film 10 and a gate electrode 1. In the second to sixth embodiments, in the case where a high voltage is applied between the collector electrode 3 and the emitter electrode 2, a location applied with the strongest electric field and caused to avalanche breakdown is a region under the insulating film 10. This tendency is remarkable in the third and fourth embodiments since the insulating film 10 exists on the collector electrode 3 side. In this case, there is a danger that the insulating film 10 is broken so that the gate electrode 1 and the emitter electrode 2 are short-circuited. In the present embodiment, on the other hand, the p layers 50 are provided on opposite sides of the insulating film 10 in a direction of thickness thereof. Therefore, in the case where a high voltage is applied, the p layers 50 are pinched off under the insulating film 10 by a depletion layer and hence an avalanche breakdown region is the interior of the semiconductor (or n− layer 20) away from the insulating film 10. As a result, no breakdown occur under the insulating film 10, thereby providing a merit that reliability is increased as compared with the second to sixth embodiments.

In the present embodiment, an emitter electrode 2 is provided on the n− layer 20 through an insulating film 11 to extend toward a collector electrode 3. A portion of the emitter electrode 2 on the insulating film 11 serves as a field plate which properly expands an depletion layer to mitigate an electric field. In the first to sixth embodiments, the gate electrode 1 on the insulating film 10 serves as a field plate. Therefore, when a potential of the gate electrode 1 is changed in order to control the IGBT, the degree of expansion of a depletion layer changes so that a breakdown voltage correspondingly changes. Especially, in FIGS. 3, 4 and 5, when a large potential which is negative relative to the emitter electrode 2 is applied to the gate electrode 1, a punch-through phenomenon that a depletion layer reaches the p+ layer 70 occurs, thereby lowering a breakdown voltage. However, in the present embodiment, since the field plate is formed by the emitter electrode 2, there is provided a merit that a breakdown voltage is stably determined by only a voltage between the collector electrode 3 and the emitter electrode 2 without depending on a control voltage applied to the gate electrode 1.

In the present embodiment, it is preferable that the p+ layer 70, the p layer 50 and an n+ layer 60 are formed with their shapes elongated in a direction perpendicular to the drawing sheet plane. In that case, a predetermined number of units one of which is shown by one-dotted line $A_0-A_0$ may be provided in accordance with a current capacity.

Figure 8:
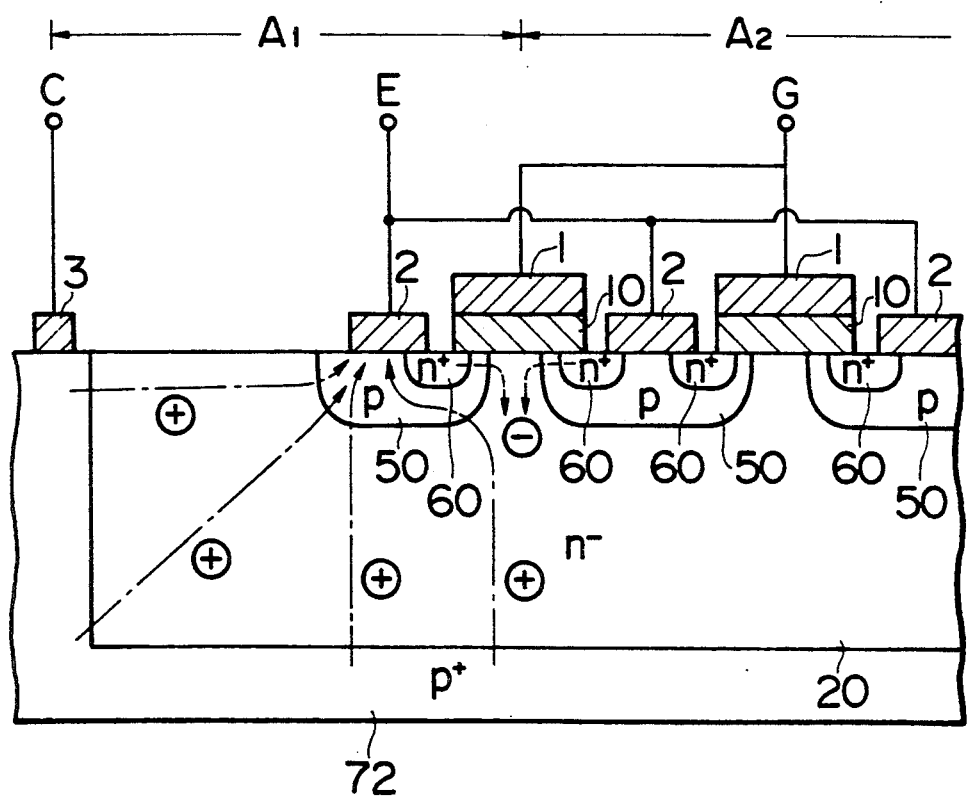

FIG. 8 is a longitudinal cross section showing an eighth embodiment of the present invention. A plurality of p layers 50 are provided in parallel in an n− layer 20 surrounded by a p+ layer 72. The outermost p layer 50 has one n+ layer 60 therein and the intermediate p layer 50 has two n+ layers 60 therein. An insulating film 10 is provided stretching over a portion of the n− layer 20 which is positioned between the p layers 50 and the p layers 50 and the n+ layers 60 which are positioned on opposite sides of that portion of the n− layer 20. A gate electrode 1 is provided on the insulating film 10. An emitter electrode 2 is provided in ohmic contact with the p layer 50 and the n+ layer 60. The p layer 50, n+ layer 60, gate electrode 1, emitter electrode 2 and p+ layer 72 positioned in the outermost periphery and the collector electrode 3 constructs a lateral IGBT $A_1$ while the p layers 50, n+ layers 60, gate electrodes 1, emitter electrodes 2 and p+ layers 72 positioned in the intermediate portion and the collector electrode 3 construct a plurality of vertical IGBT's $A_2$.

In the present embodiment, in an area $A_2$, positive holes ⊕ are injected from only the p+ layer 72 lying in the bottom part. In an area $A_1$, on the other hand, positive holes ⊕ are injected not only from the p+ layer 72 lying in the bottom part but also from the p+ layer 72 lying in the side part. Therefore, the positive holes are concentrated in the area $A_1$. However, in the area $A_1$, since a region where the emitter electrode 2 is in ohmic contact with the p layer 50 is provided nearer to the p+ layer 72 than the n+ layer 60, the positive holes arrive at the emitter electrode 2 without passing under the n+ layer 60, thereby providing the benefit that the latch-up prevention ability is improved.

Figure 9A:
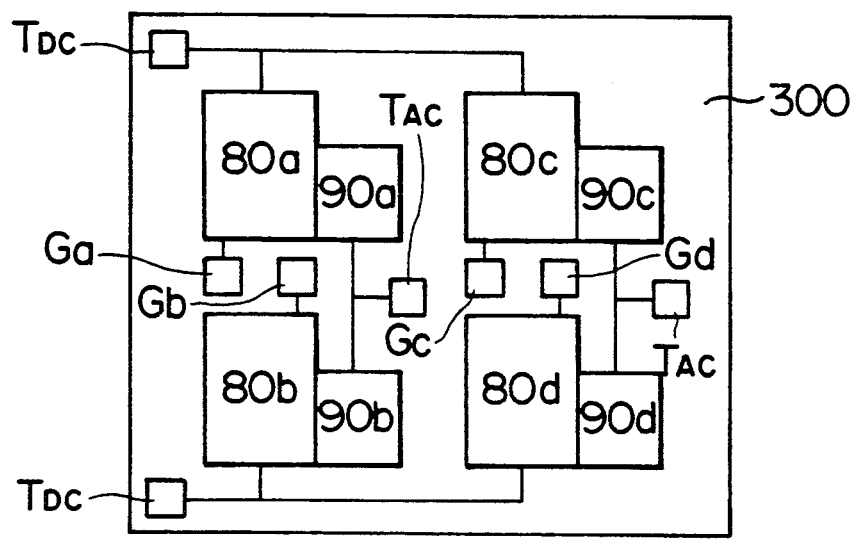
FIGS. 9A and 9B are a schematic plan view and a circuit diagram respectively of a power converting device in which the present invention is used.
Figure 9B:
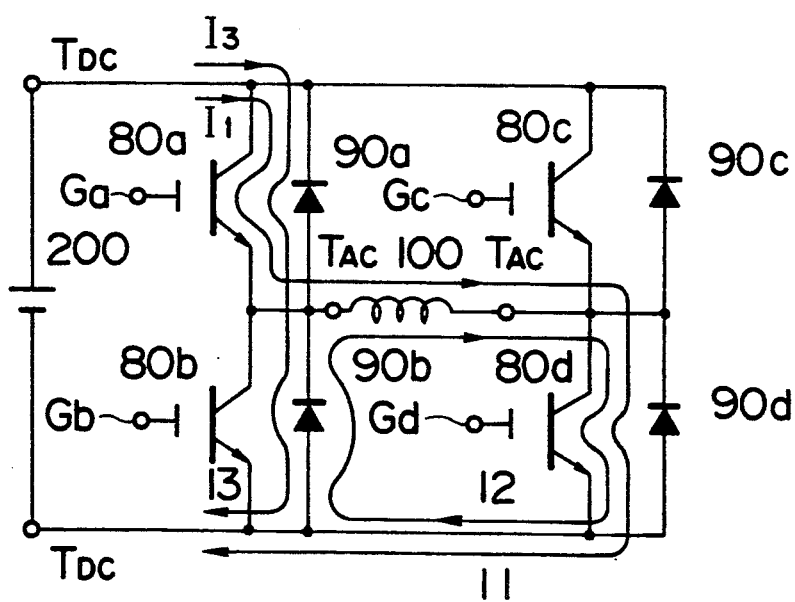
Figure 10:
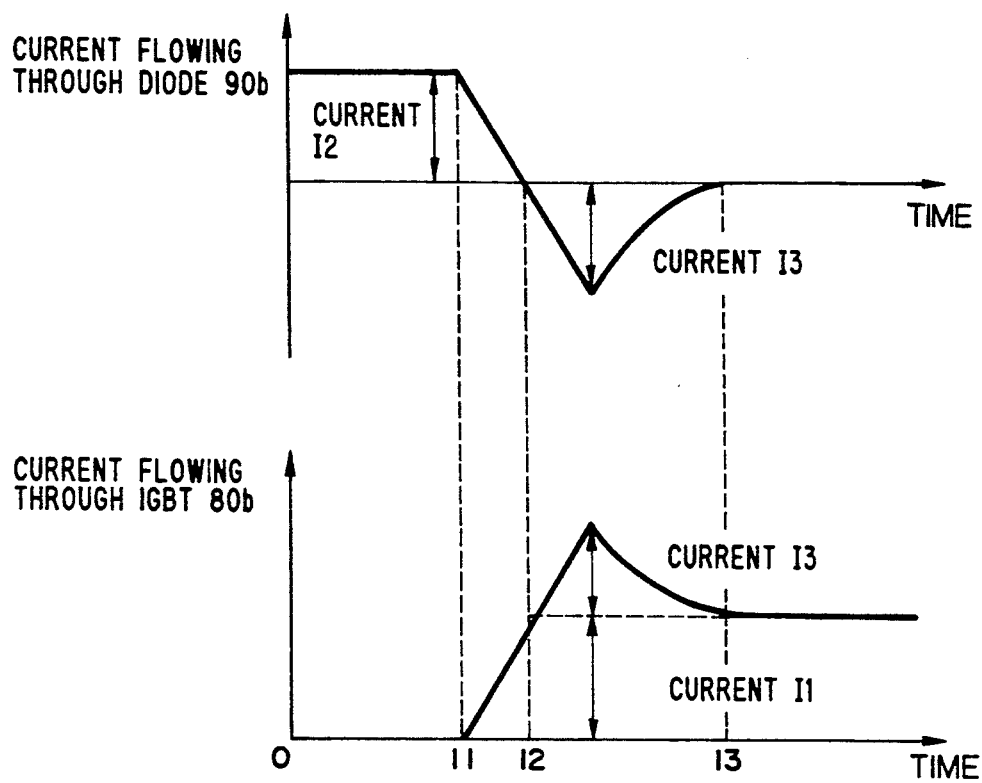
FIG. 10 shows current waveforms for explaining the operation of the device shown in FIGS. 9A and 9B.
Figure 11:
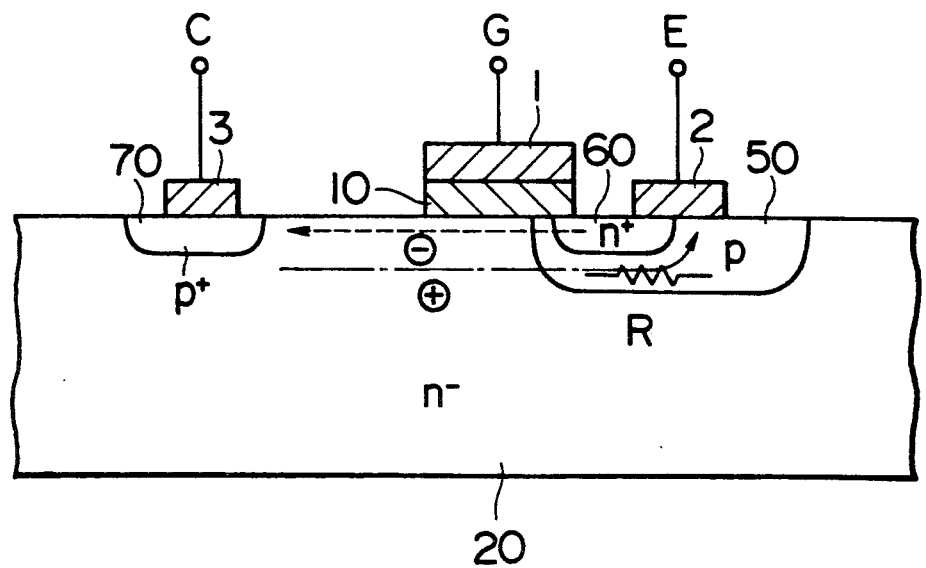
FIG. 11 is a longitudinal cross section view of the conventional lateral IGBT.

FIGS. 9A and 9B are a schematic plan view and a circuit diagram of an example of a power converting device to which lateral IGBT's according to the present invention are applied, more particularly, an inverter in which a current is controlled by turning on/off four lateral IGBT's. In the figures, reference numerals 80a, 80b, 80c and 80d designate lateral IGBT's formed in an island-like area of a dielectric-isolated substrate 300, numerals 90a, 90b, 90c and 90d diodes formed in another island-like area of the dielectric-isolated substrate 300, symbol $T_{AC}$ an AC terminal, symbol $T_{DC}$ DC terminals, symbols $G_a$, $G_b$, $G_c$ and $G_d$ gate terminals, numeral 100 a load, and numeral 200 a DC power source. Such a device may involve an operation in which the IGBT 80a is turned on when a current is flowing through the diode 90b. Namely, when the IGBT 80a is turned off in order to control a current in a state in which the IGBT's 80a and 80d are in ON state so that a current $I_1$ flows, a current $I_2$ flows through the IGBT 80d and the diode 90b. At this time, if the IGBT 80a is turned on again, a power source voltage is applied across the diode 90b so that excess carriers having been stored in the diode 90d are swept out, thereby causing a current $I_3$ to flow transiently. This transient state is schematically shown in FIG. 10. When the IGBT 80a is turned on at instant of time $t=t_1$, the current $I_2$ flows through the diode 90b is decreased and at instant of time $t=t_2$ the current $I_3$ having a direction reverse to that of the current $I_2$ starts to flow through the diode 90b. At this time, a current of $I_1+I_3$ flows through the IGBT 80a until instant of time $t=t_3$ when the current $I_3$ becomes zero. Thus, an excessive current flows through the IGBT 80a during a period of time from $t_2$ to $t_3$. Therefore, in the conventional lateral IGBT, latch-up occurs, thereby making it impossible to control a current. However, in the power converting device in which the lateral IGBT's according to the present invention are used, no impossibility of control is encountered since the latch-up prevention ability is improved.

In the foregoing, typical examples of the present invention have been disclosed. However, it should be noted that the present invention is not limited to the disclosed embodiments and various changes or modifications are possible.

In a lateral insulated gate bipolar transistor according to the present invention, since a region where a semiconductor layer having the same conductivity type as a collector layer contacts an emitter electrode is provided nearer to the collector layer than an emitter layer, the latch-up prevention ability is improved, thereby making it possible to control a large current.

What is claimed is:

1. A lateral insulated gate bipolar transistor comprising a first semiconductor region of a first conductivity type, second and third semiconductor regions of a second conductivity type provided apart from each other and extending from a surface of said first semiconductor region thereinto, a fourth semiconductor region of said first conductivity type extending from a surface of said second semiconductor region thereinto, an insulating film formed on surfaces of said first, second and fourth semiconductor regions to stretch over said first, second and fourth semiconductor regions, a control electrode formed on said insulating film, a first main electrode provided in ohmic contact with surfaces of said second and fourth semiconductor regions, and a second main electrode provided in ohmic contact with a surface of said third semiconductor region, a distance between said control electrode and said second main electrode being greater than a distance between said first main electrode and said second main electrode, and in operation a voltage is applied between said first main electrode and said second main electrode, said voltage having a polarity forward biasing a PN junction formed between said third semiconductor region and said first semiconductor region.

2. A lateral insulated gate bipolar transistor according to claim 1, wherein said first semiconductor region is formed on the side of one surface of a semiconductor substrate of said second conductivity type to extend from the one surface into the interior.

3. A lateral insulated gate bipolar transistor according to claim 1, wherein said first semiconductor region is a monocrystalline region island-wise formed in a dielectric-isolated substrate.

4. A lateral insulated gate bipolar transistor according to claim 1, wherein a fifth semiconductor region of said first conductivity type having an impurity concentration higher than that of said first semiconductor region is provided apart from said second semiconductor region and extending from a surface of said first semiconductor region opposite the surface where said second semiconductor region is provided.

5. A lateral insulated gate bipolar transistor according to claim 1, wherein said first main electrode extends on said first semiconductor region through an insulating film toward said third semiconductor region.

6. A lateral insulated gate bipolar transistor according to claim 1, wherein said second, third and fourth semiconductor regions are formed in the surface of said first semiconductor region with their shapes elongated in one direction, and said first and second main electrodes, and said control electrode formed with their shapes elongated in said one direction.

7. A lateral insulated gate bipolar transistor comprising a first semiconductor region of a first conductivity type, second and third semiconductor regions of a second conductivity type provided apart from each other and with their shapes elongated in one direction in a surface of said first semiconductor region to extend from the surface of said first semiconductor region thereinto, a plurality of fourth semiconductor regions of said first conductivity type formed in a row along a longitudinal direction of said second semiconductor region and extending from a surface of said second semiconductor region thereinto, a plurality of first main electrodes respectively provided in ohmic contact with a surface of said plurality of fourth semiconductor regions and a surface of said second semiconductor region near to said third semiconductor region, a second main electrode provided in ohmic contact with a surface of said third semiconductor region along a longitudinal direction of said third semiconductor region, an insulating film formed on surfaces of said first and second semiconductor regions and on surfaces of said first, second and plurality of fourth semiconductor regions, said insulating film thereby formed around said plurality of first main electrodes, and a control electrode formed on said insulating film, wherein in operation, a voltage is applied between said plurality of first main electrodes and said second main electrode, said voltage having a polarity forward biasing a PN junction formed between said third semiconductor region and said first semiconductor region.

8. A lateral insulated gate bipolar transistor according to claim 7, wherein said first semiconductor region is a region formed on the side of one surface of a semiconductor substrate of said second conductivity type to extend from the one surface into the interior.

9. A lateral insulated gate bipolar transistor according to claim 7, wherein said first semiconductor region is a monocrystalline region island-wise formed in a dielectric-isolated substrate.

10. A lateral insulated gate bipolar transistor according to claim 7, wherein said control electrode is formed separate from said plurality of first main electrodes and surrounds said plurality of first main electrodes.

11. A lateral insulated gate bipolar transistor comprising a first semiconductor region of a first conductivity type, second and third semiconductor regions of a second conductivity type provided apart from each other and with their shapes elongated in one direction in a surface of said first semiconductor region to extend from the surface of said first semiconductor region thereinto, a plurality of fourth semiconductor regions of said first conductivity type formed in a row along a longitudinal direction of said second semiconductor region and extending from a surface of said second semiconductor region thereinto, fifth and sixth semiconductor regions of said first conductivity type extending from a surface of said second semiconductor region thereinto, said fifth and sixth semiconductor regions extending along the longitudinal direction of said second semiconductor region and apart from said plurality of fourth semiconductor regions on opposite sides thereof, a plurality of first main electrodes provided in ohmic contact respectively with surfaces of said plurality of fourth semiconductor regions and a surface of said second semiconductor region which is near to said third semiconductor region, a second main electrode provided in ohmic contact with a surface of said third semiconductor region along a longitudinal direction of said third semiconductor region, a first control electrode contacting an insulating film formed on surfaces of said second, plurality of fourth and fifth semiconductor regions, a second control electrode contacting an insulating film formed on surfaces of said first, second and sixth semiconductor regions to stretch over said first, second and sixth semiconductor regions and electrically connected to said first control electrode, and means for electrically connecting said fifth semiconductor region and said sixth semiconductor region, wherein in operation, a voltage is applied between said plurality of first main electrodes and said second main electrode, said voltage having a polarity forward biasing a PN junction formed between said third semiconductor region and said first semiconductor region.

12. A lateral insulated gate bipolar transistor comprising a first semiconductor region of a first conductivity type, second and third semiconductor regions of a second conductivity type juxtaposed apart from each other and with their shapes elongated in one direction in a surface of said first semiconductor region to extend from the surface of said first semiconductor region thereinto, fourth and fifth semiconductor regions of said second conductivity type formed on opposite sides of the juxtaposed second and third semiconductor regions respectively to extend from a surface of said first semiconductor region thereinto, sixth and seventh semiconductor regions of said first conductivity type formed along longitudinal directions of said second and third semiconductor regions respectively to extend from surfaces of said second and third semiconductor regions thereinto, a first main electrode provided in ohmic contact with said sixth semiconductor region and said second semiconductor region positioned on the side of said sixth semiconductor region near to said fourth semiconductor region, a second main electrode provided in ohmic contact with said seventh semiconductor region and said third semiconductor region positioned on the side of said seventh semiconductor region near to said fifth semiconductor region, means for electrically connecting said first main electrode and said second main electrode, third and fourth main electrodes provided in ohmic contact with said fourth and fifth semiconductor regions respectively, means for electrically interconnecting said third and fourth main electrodes, and a control electrode provided on an insulating film formed only on surfaces of said second semiconductor region, said third semiconductor region, said first semiconductor region exposed between said second and third semiconductor regions, said sixth semiconductor region and said seventh semiconductor regions to stretch over said second, third, first, sixth and seventh semiconductor regions, wherein in operation, voltages are respectively applied between said first and second main electrodes and between said third and said fourth main electrodes, said voltages having polarities to forward bias PN junctions respectively formed between said third and first semiconductor regions and between said fourth and first semiconductor regions.

13. A lateral insulated gate bipolar transistor according to claim 12, wherein said first semiconductor region is a region formed on the side of one surface of a semiconductor substrate of said second conductivity type to extend from the one surface into the interior.

14. A lateral insulated gate bipolar transistor according to claim 12, wherein said first semiconductor region is a monocrystalline region island-wise formed in a dielectric-isolated substrate.

15. A lateral insulated gate bipolar transistor according to claim 1, wherein a distance from where said first main electrode is in ohmic contact with said second semiconductor region to said third semiconductor region is less than distance between said fourth semiconductor region and said third semiconductor region.

16. A lateral insulated gate bipolar transistor according to claim 11, wherein said means for electrically connecting said fifth semiconductor region and said sixth semiconductor region is a conductor extending over the first semiconductor region.

17. A lateral insulated gate bipolar transistor according to claim 11, wherein said means for electrically connecting said fifth semiconductor region and said sixth semiconductor region is a semiconductor layer of the first conductivity type extending between the fifth and sixth semiconductor regions.

18. A lateral insulated gate bipolar transistor according to claim 1, wherein said first semiconductor region is provided on a fifth semiconductor region, of the second conductivity type, and wherein the transistor further comprises a sixth semiconductor region extending from the surface of the first semiconductor to said fifth semiconductor region, and surrounding a portion of the first semiconductor region having said second and third semiconductor regions therein.

19. A lateral insulated gate bipolar transistor according to claim 18, wherein an electrode is provided in ohmic contact with the sixth semiconductor region, whereby the fifth and sixth semiconductor regions can be reverse biased with respect to the first semiconductor region.

20. A lateral insulated gate bipolar transistor according to claim 3, further comprising a fifth semiconductor region, of the first conductivity type, interposed between an insulator film providing the dielectric-isolated substrate and the first semiconductor region, said fifth semiconductor region having a higher impurity concentration than the first semiconductor region.

21. A lateral insulated gate bipolar transistor according to claim 12, wherein a distance between said control electrode and said third main electrode is greater than a distance between said first main electrode and said third main electrode, and a distance between said control electrode and said fourth main electrode is greater than a distance between said second main electrode and said fourth main electrode.

22. A lateral insulated gate bipolar transistor comprising a first semiconductor region of a first conductivity type, wherein said first semiconductor region is a monocrystalline region island-wise formed in a dielectric-isolated substrate, second and third semiconductor regions of a second conductivity type provided apart from each other and extending from a surface of said first semiconductor region thereinto, a fourth semiconductor region of said first conductivity type extending from a surface of said second semiconductor region thereinto, an insulating film formed on surfaces of said first, second and fourth semiconductor regions to stretch over said first, second and fourth semiconductor regions, a fifth semiconductor region, of the first conductivity type, interposed between an insulator film providing the dielectric-isolated substrate and the first semiconductor region, said fifth semiconductor region having a higher impurity concentration than the first semiconductor region, a sixth semiconductor region of the first conductivity type extending from the surface of the first semiconductor region such that the third semiconductor region is provided in the sixth semiconductor region, the sixth semiconductor region having a higher impurity concentration than that of the first semiconductor region, and a seventh semiconductor region of the second conductivity type, provided adjacent the fourth semiconductor region and extending from the surface of the second semiconductor region into the second semiconductor region said seventh semiconductor region having a higher impurity concentration than that of the second semiconductor region, a control electrode formed on said insulating film, a first main electrode provided in ohmic contact with surfaces of said seventh and fourth semiconductor regions, and a second main electrode provided in ohmic contact with a surface of said third semiconductor region, a distance between said control electrode and said second main electrode being greater than a distance between said first main electrode and said second main electrode, and in operation a voltage is applied between said first main electrode and said second main electrode, said voltage having a polarity forward biasing a PN junction formed between said third semiconductor region and said first semiconductor region.

23. A lateral insulated gate bipolar transistor comprising a first semiconductor region of a first conductivity type, second and third semiconductor regions of a second conductivity type juxtaposed apart from each other and with their shapes elongated in one direction in a surface of said first semiconductor region to extend from the surface of said first semiconductor region thereinto, fourth and fifth semiconductor regions of said second conductivity type formed on opposite sides of the juxtaposed second and third semiconductor regions respectively to extend from a surface of said first semiconductor region thereinto, sixth and seventh semiconductor regions of said first conductivity type formed along longitudinal directions of said second and third semiconductor regions respectively to extend from surfaces of said second and third semiconductor regions thereinto, a first main electrode provided in ohmic contact with said sixth semiconductor region and said second semiconductor region positioned on the side of said sixth semiconductor region near to said fourth semiconductor region, a second main electrode provided in ohmic contact with said seventh semiconductor region and said third semiconductor region positioned on the side of said seventh semiconductor region near to said fifth semiconductor region, each of said first and second main electrodes contacting an insulating film and said insulating film extending on said first semiconductor region, means for electrically connecting said first main electrode and said second main electrode, third and fourth main electrodes provided in ohmic contact with said fourth and fifth semiconductor regions respectively, means, for electrically interconnecting said third and fourth main electrodes, and a control electrode provided on an insulating film formed on surfaces of said second semiconductor region, said third semiconductor region, said first semiconductor region exposed between said second and third semiconductor regions, said sixth semiconductor region and said seventh semiconductor regions to stretch over said second, third, first, sixth and seventh semiconductor regions, wherein in operation, voltages are respectively applied between said first and second main electrodes and between said third and said fourth main electrodes, said voltages having polarities to forward bias PN junctions respectively formed between said third and first semiconductor regions and between said fourth and first semiconductor regions.

* * * * *